United States Patent [19]
Hsu

[11] Patent Number: 6,162,722
[45] Date of Patent: Dec. 19, 2000

[54] UNLANDED VIA PROCESS

[75] Inventor: Shih-Ying Hsu, Hsin-Chu, Taiwan

[73] Assignee: United Microelectronics Corp., Hsin-Chu, Taiwan

[21] Appl. No.: 09/312,969

[22] Filed: May 17, 1999

[51] Int. Cl.[7] .................. H01L 21/4763; H01L 21/302; H01L 21/31; H01L 21/44; H01L 29/40

[52] U.S. Cl. .............. 438/637; 438/624; 438/626; 438/666; 438/675; 438/738; 438/740; 438/742; 438/743; 438/744; 257/773; 257/774

[58] Field of Search ................... 438/637, 645, 438/646, 622, 623, 624, 626, 666, 675

[56] References Cited

U.S. PATENT DOCUMENTS

| | | | |
|---|---|---|---|
| 4,541,169 | 9/1985 | Bartush | 29/591 |
| 5,451,543 | 9/1995 | Woo et al. | 438/637 |
| 5,466,636 | 11/1995 | Cronin et al. | 438/392 |
| 5,538,922 | 7/1996 | Cooper et al. | 438/634 |
| 5,593,919 | 1/1997 | Lee et al. | 438/626 |
| 5,700,737 | 12/1997 | Yu et al. | 438/636 |
| 5,702,981 | 12/1997 | Maniar et al. | 438/627 |
| 5,707,901 | 1/1998 | Cho et al. | 438/595 |
| 5,726,100 | 3/1998 | Givens | 438/702 |
| 5,789,315 | 8/1998 | Besser et al. | 438/624 |
| 5,801,093 | 9/1998 | Lin | 438/624 |
| 5,801,099 | 9/1998 | Kim et al. | 438/666 |
| 5,882,999 | 3/1999 | Anderson et al. | 438/629 |
| 5,935,868 | 8/1999 | Fang et al. | 438/692 |
| 5,935,876 | 8/1999 | Lee et al. | 438/738 |
| 5,960,316 | 9/1999 | Bai | 438/633 |
| 5,981,379 | 11/1999 | Tsai | 438/638 |
| 5,989,957 | 11/1999 | Ngo et al. | 438/257 |
| 6,015,751 | 1/2000 | Liu | 438/637 |

OTHER PUBLICATIONS

S. Wolf, "Silicon Processing for the VLSI Era", vol. 2, pp. 199, 223, and 230, Lattice Press, Sunset Beach, CA, USA, 1990.

*Primary Examiner*—Tom Thomas
*Assistant Examiner*—Bernard E. Souw
*Attorney, Agent, or Firm*—Harness, Dickey & Pierce, P.L.C.

[57] ABSTRACT

A method is provided for forming an unlanded via hole that substantially solves both the problems of high resistance and via profile loss due to etching. A patterned conductor layer on a first dielectric layer is provided firstly. A first insulating layer is then formed on the first dielectric layer and the conductor layer. A second dielectric layer is formed on the first insulating layer and subsequently etched back until the conductor layer is exposed. The following procedure is to form a second insulating layer on the second dielectric layer and the conductor layer. A third dielectric layer is formed on the second insulating layer. Thereafter, a patterned photoresist layer is formed on the third dielectric layer. Then the etching process is used to etch the third dielectric layer and the second insulating layer to form an unlanded via hole. Finally, the photoresist layer is removed. The unlanded via hole proposed in according with the present invention produces an unlanded via having a good profile.

20 Claims, 2 Drawing Sheets

UNLANDED VIA PROCESS

BACKGROUND OF THE INVENTION

1. Field of the Invention

The present invention relates to an unlanded via process, and more particularly, to a method for forming an unlanded via hole.

2. Description of the Prior Art

The technology of semiconductors is improving daily. To increase the scale of integrated circuits, the technology of multilevel interconnects has been developed. In such an integrated circuit, the patterned conductive material on one interconnect level is electrically insulated from the patterned conductive material on another level by a dielectric layer (e.g., a silicon dioxide layer). This dielectric layer is called inter-metal dielectrics (IMD). For the specific-point contact of two levels, via holes are opened in the dielectrics and filled by an electrical conductor. These structures are often referred to as vias.

In some cases, it is necessary to increase the width of the underlying conductive material to provide the landing of the conductor formed in the via hole. Therefore, the increase in minimum width increases the pitch, and correspondingly decreases the packing density. The pitch described above is the width of an interconnect line and the space required between those lines.

For submicron technology, in order to reduce the pitch and save the area, the unlanded via process was developed. Its use has been suggested to form an unlanded via hole, which could contain the conductor unlanded on the underlying conductive material, instead of the original landing via hole. That is, when the conductor in the via hole connects with the underlying conductive material, it is not necessary that the underlying conductive material contains completely the bottom area of the conductor which is in the via hole. In the conventional process, unlanded via etching is the critical step. It should be optimized between high resistance and via profile loss. Therein, the high resistance is due to insufficient etching shown in FIG. 1. Referring to FIG. 2, the via profile loss is due to too much overetching. This also makes via resistance high and the following process, such as barrier forming, to be out of control.

For the foregoing reasons, there is a need for a method of forming an unlanded via hole which can substantially improve the high resistance and the via profile loss problem which occurrs in an unlanded via etching processes.

SUMMARY OF THE INVENTION

In accordance with the present invention, a method is provided for forming an unlanded via hole that substantially solves both the problems of high resistance and via profile loss due to etching. In one embodiment, a metal layer on a first dielectric layer is provided firstly. A silicon-rich oxide layer is then formed on the first dielectric layer and the metal layer by plasma enhanced chemical vapor deposition (PECVD). A spin-on glass (SOG) layer is formed on the silicon-rich oxide layer and subsequently etched back until the metal layer is exposed. The following procedure is to deposite a silicon nitride layer on the SOG layer and the metal layer. An oxide layer is deposited on the silicon nitride layer and planarized by chemical mechanical polishing (CMP). Thereafter, a patterned photoresist layer is formed on the oxide layer. Then the etching process is used to etch the oxide layer and the silicon nitride layer to form an unlanded via hole. Finally, the photoresist layer is removed.

The unlanded via hole provided by the invention would give the unlanded via a good profile.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
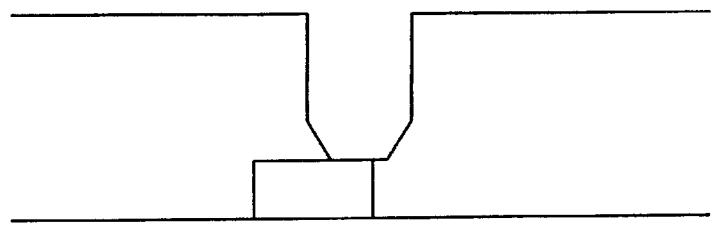
FIG. 1 shows a cross-sectional view illustrative of an insufficiently-etched unlanded via hole.
Figure 2:
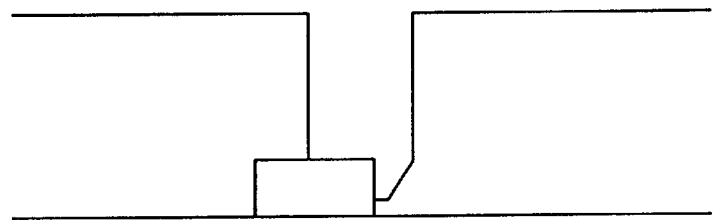
FIG. 2 shows a cross-sectional view illustrative of an overetched unlanded via hole.
Figure 3:
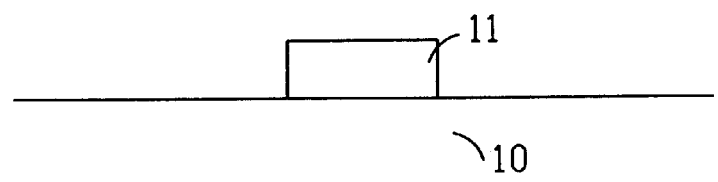
FIGS. 3–7 show the cross-sectional views illustrative of various stages of fabrication of an unlanded via hole according to the present invention.

Referring to FIG. 3, firstly a structure is provided, in which a conductor layer 11 is formed and patterned on a first dielectric layer 10. The component of the conductor 11 is usually metal, such as aluminum (Al) or copper (Cu). The structure exhibits a conductive level of multilevel interconnects.

Figure 4:
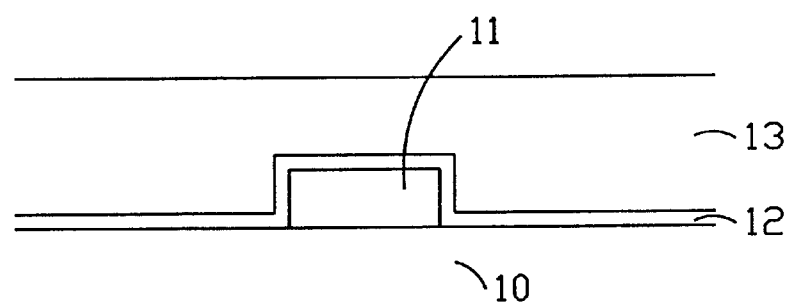

Referring to FIG. 4, a silicon-rich oxide (SRO) layer 12 which has a thickness in the range of approximately 100 nm to approximately 200 nm is formed on the first dielectric layer 10 and the metal layer 11 by CMP. A spin-on glass (SOG) 13 is then formed on the silicon-rich oxide layer 12. Therein, the SRO 12 having a dense structure is used to insulate the metal layer 11 from vapor contained in SOG. In sub-micron dimensions, the SOG can fill a narrower space without causing voids than can CVD intermetal dielectric layer. SOG materials are siloxanes or silicates mixed in alcohol-based solvents, the primary difference between them being that a small percentage of Si—C bonds remain in the siloxane-based SOGs following the final cure cycle. Upon baking, the solvents are driven off and the remaining solid layer exhibits properties similar to those of $SiO_2$. Silicate SOGs can also be doped with such compounds as $P_2O_5$ to improve their dielectric layer properties. Other advantages of SOG include simpler processing, lower defect density, higher throughput, relatively low cost and no the elimination of handing of hazardous gases.

Figure 5:
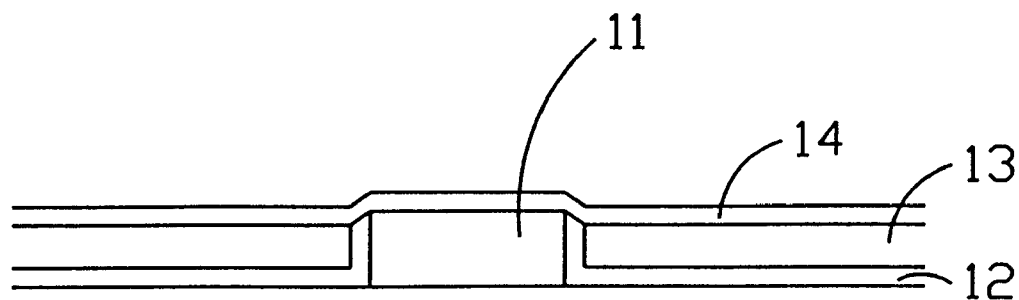

Referring to FIG. 5, the SOG layer 13 is etched back until the metal 11 is exposed. Subsequently, a silicon nitride (SiN) layer 14 is formed on the metal 11 and the etched SOG 13. Plasma-enhanced chemical vapor deposition (PECVD) is used in its formation. The silicon nitride 14, approximately 30 to 100 nm thick, is used as the stop layer of following etching process.

Figure 6:
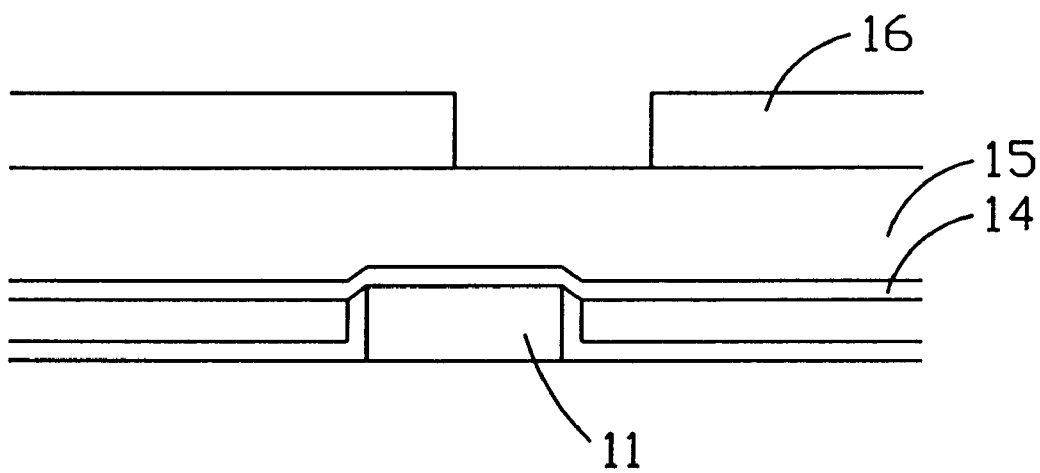

Referring to FIG. 6, an oxide layer 15, approximately 700 to 1100 nm thick, is deposited on the silicon nitride layer 14 by a PECVD process. The oxide layer 15, used as an inter-metal dielectric (IMD), is subsequently provided with a chemical-mechanical polishing (CMP) to eliminate the height non-uniformities at the surface. The CMP, used to achieve a planar surface over the entire chip and wafer, is a common planarizing technique. Then, a patterned photoresist layer 16, in which an unlanded via hole is defined, is formed on the oxide layer 15.

Figure 7:
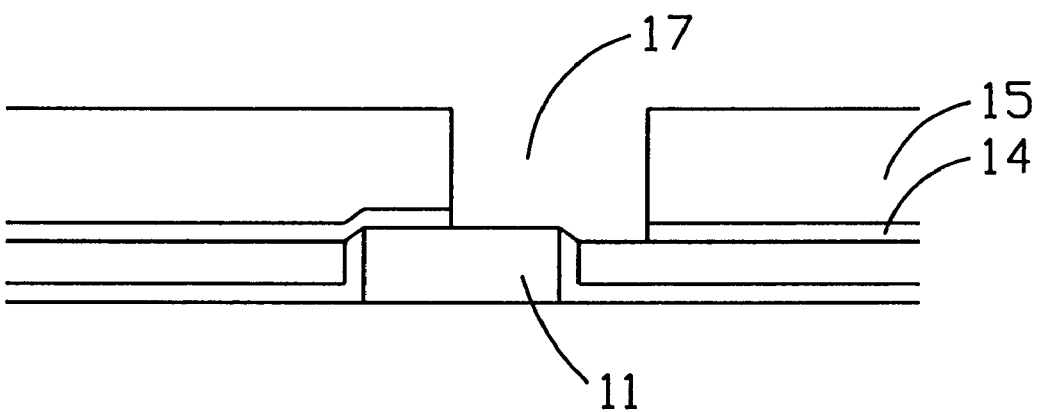

Referring to FIG. 7, an etching process with a proper range of selectivity (10–15 etches) tis used to etch he oxide 15 and silicon nitride 14 until the metal 11 is exposed. An unlanded via hole 17 is formed. Finally, the photoresist layer is removed. When the oxide etching is finished, the SiN layer will reduce the etching rate because of the selectivity 10–15 and be etched completely in a fixed time. Owing to the SiN stop layer, the problem of overetching would be solved. Moreover, enough etching time would result in the good profile of an unlanded via hole. The disadvantage of high resistance of an unlanded via would be avoided.

Although specific embodiments have been illustrated and described, it will be obvious to those skilled in the art that various modifications may be made without departing from what is intended to be limited solely by the appended claims.

What is claimed is:

1. A method for forming a via hole, comprising:

providing a patterned (conductor) metal on a first dielectric layer;

forming a first insulating layer on said first dielectric layer and said patterned (conductor) metal;

forming a second dielectric layer on said first insulating layer;

etching said second dielectric layer until said patterned (conductor) metal exposes;

forming a second insulating layer on said second dielectric layer and said patterned (conductor) metal;

forming a third dielectric layer on said second insulating layer;

forming a patterned photoresist layer on the third dielectric;

masking by said patterned photoresist layer to form(ing) a preparatory via hole through said third dielectric layer and stopping on said second insulating layer (to said patterned conductor);

forming a unlanded via hole by extending said preparatory via hole through said second insulating layer to said patterned metal and stopping on said first insulating layer and said second dielectric layer; and removing said patterned photoresist layer.

2. The method according to claim 1, wherein said patterned conductor comprises one of following elements: aluminum (Al), copper (Cu).

3. The method according to claim 1, wherein said first dielectric layer comprises silicon dioxide.

4. The method according to claim 1, wherein said first insulating layer comprises silicon-rich oxide.

5. The method according to claim 1, wherein said first insulating layer is formed by plasma enhanced chemical vapor deposition (PECVD).

6. The method according to claim 1, wherein said second dielectric layer comprises spin-on glass (SOG).

7. The method according to claim 6, wherein said SOG includes one of the following: silicate SOG and siloxane SOG.

8. The method according to claim 1, wherein said second insulating layer comprises silicon nitride.

9. The method according to claim 8, wherein said silicon nitride layer is formed by plasma-enhanced chemical vapor deposition (PECVD) process.

10. The method according to claim 1, wherein said third dielectric layer comprises silicon dioxide.

11. The method according to claim 10, wherein said oxide layer is formed by PECVD process.

12. The method according to claim 1, wherein said patterned photoresist layer is formed by one of the follow: deposition process and spin coating process.

13. The method according to claim 1, wherein said unlanded via hole is formed by etching.

14. A method for forming an unlanded via hole in multilevel interconnects process, comprising:

providing a metal layer on a first dielectric layer;

forming a silicon-rich oxide layer on said first dielectric layer and said metal layer by PECVD;

forming a SOG layer on said silicon-rich oxide layer;

etching said SOG layer until said metal layer exposes;

forming a silicon nitride layer on said SOG layer and said metal layer;

forming an oxide layer on said silicon nitride layer;

forming a patterned photoresist layer on said oxide layer;

etching said oxide layer and said silicon nitride layer, until said metal layer exposes, to form an unlanded via hole, wherein the etching step stops on said silicon-rich oxide layer and said SOG layer; and removing said patterned photoresist layer.

15. The method according to claim 14, wherein said metal is patterned.

16. The method according to claim 14, wherein said first dielectric layer comprises silicon dioxide.

17. The method according to claim 14, wherein said SOG layer comprises one of the following: silicate SOG and siloxane SOG.

18. The method according to claim 14, wherein said silicon nitride layer is formed by PECVD process.

19. The method according to claim 14, wherein said oxide layer is formed by PECVD process.

20. The method according to claim 14, wherein said patterned photoresist layer is formed by deposition process.

* * * * *